(12) United States Patent
Lee et al.

(10) Patent No.: US 10,861,974 B2
(45) Date of Patent: Dec. 8, 2020

(54) SEMICONDUCTOR STRUCTURE AND PROCESS THEREOF

(71) Applicant: UNITED MICROELECTRONICS CORP., Hsin-Chu (TW)

(72) Inventors: Zhi-Cheng Lee, Tainan (TW); Wei-Jen Chen, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/361,231

(22) Filed: Mar. 22, 2019

(65) Prior Publication Data

US 2020/0295176 A1    Sep. 17, 2020

(30) Foreign Application Priority Data

Mar. 13, 2019 (CN) .......................... 2019 1 0187678

(51) Int. Cl.
| | |
|---|---|
| *H01L 29/78* | (2006.01) |
| *H01L 29/51* | (2006.01) |
| *H01L 29/66* | (2006.01) |
| *H01L 29/06* | (2006.01) |
| *H01L 29/165* | (2006.01) |

(52) U.S. Cl.
CPC ........ *H01L 29/785* (2013.01); *H01L 29/0649* (2013.01); *H01L 29/165* (2013.01); *H01L 29/517* (2013.01); *H01L 29/66545* (2013.01); *H01L 29/66795* (2013.01)

(58) Field of Classification Search
CPC . H01L 29/0649; H01L 29/165; H01L 29/517; H01L 29/66545; H01L 29/66795; H01L 29/785
See application file for complete search history.

(56) References Cited

U.S. PATENT DOCUMENTS

| 6,894,337 | B1* | 5/2005 | Wang ............... H01L 29/66795 257/302 |
| 8,729,638 | B2* | 5/2014 | Zhu ................... H01L 29/66795 257/369 |
| 9,627,270 | B2 | 4/2017 | Cheng |
| 9,728,621 | B1* | 8/2017 | Cheng ................ H01L 29/4983 |
| 9,953,977 | B1 | 4/2018 | Cheng |
| 2017/0229310 | A1 | 8/2017 | Fung |
| 2017/0256615 | A1 | 9/2017 | Chen |
| 2018/0212066 | A1 | 7/2018 | Cheng |
| 2019/0280088 | A1* | 9/2019 | Xu ..................... H01L 29/42392 |
| 2020/0044046 | A1* | 2/2020 | Zhou ................. H01L 29/42392 |

* cited by examiner

*Primary Examiner* — Allan R Wilson
(74) *Attorney, Agent, or Firm* — Winston Hsu

(57) ABSTRACT

A semiconductor structure includes at least one stacked fin structure, a gate and a source/drain. At least one stacked fin structure is located on a substrate, wherein the stacked fin structure includes a first fin layer and a second fin layer, and a fin dielectric layer is sandwiched by the first fin layer and the second fin layer. The gate is disposed over the stacked fin structure. The source/drain is disposed directly on the substrate and directly on sidewalls of the whole stacked fin structure. The present invention provides a semiconductor process formed said semiconductor structure.

16 Claims, 4 Drawing Sheets

SEMICONDUCTOR STRUCTURE AND PROCESS THEREOF

BACKGROUND OF THE INVENTION

1. Field of the Invention

The present invention relates generally to a semiconductor structure and process thereof, and more specifically to a semiconductor structure including a stacked fin structure and process thereof.

2. Description of the Prior Art

With increasing miniaturization of semiconductor devices, various multi-gate MOSFET devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

SUMMARY OF THE INVENTION

The present invention provides a semiconductor structure and process thereof, which forms a stacked fin structure to improve the controlling of a gate.

The present invention provides a semiconductor structure including at least one stacked fin structure, a gate and a source/drain. The stacked fin structure is located on a substrate, wherein the stacked fin structure includes a first fin layer, a second fin layer, and a fin dielectric layer sandwiched by the first fin layer and the second fin layer. The gate is disposed over the stacked fin structure. The source/drain is disposed directly on the substrate and on sidewalls of the whole stacked fin structure.

The present invention provides a semiconductor process including the following steps. A stacked layer is formed on a substrate, wherein the stacked layer includes a first layer, a dielectric layer and a second layer stacked from bottom to top. The stacked layer is patterned to form at least one stacked fin structure on the substrate, wherein the stacked fin structure includes a first fin layer, a second fin layer, and a fin dielectric layer sandwiched by the first fin layer and the second fin layer. A gate is disposed over the stacked fin structure. The stacked fin structure beside the gate is etched to form recesses in the stacked fin structure and expose the substrate. A source/drain is formed in the recesses and directly on the substrate.

According to the above, the present invention provides a semiconductor structure and process thereof, which forms a stacked fin structure on a substrate, wherein the stacked fin structure includes a plurality of fin layers and a plurality of fin dielectric layers, and each of the fin layers is sandwiched by the fin dielectric layers, to electrically isolate the fin layers and the substrate from each other. Thus, as a gate is disposed over the stacked fin structure, the controlling of the gate can be improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
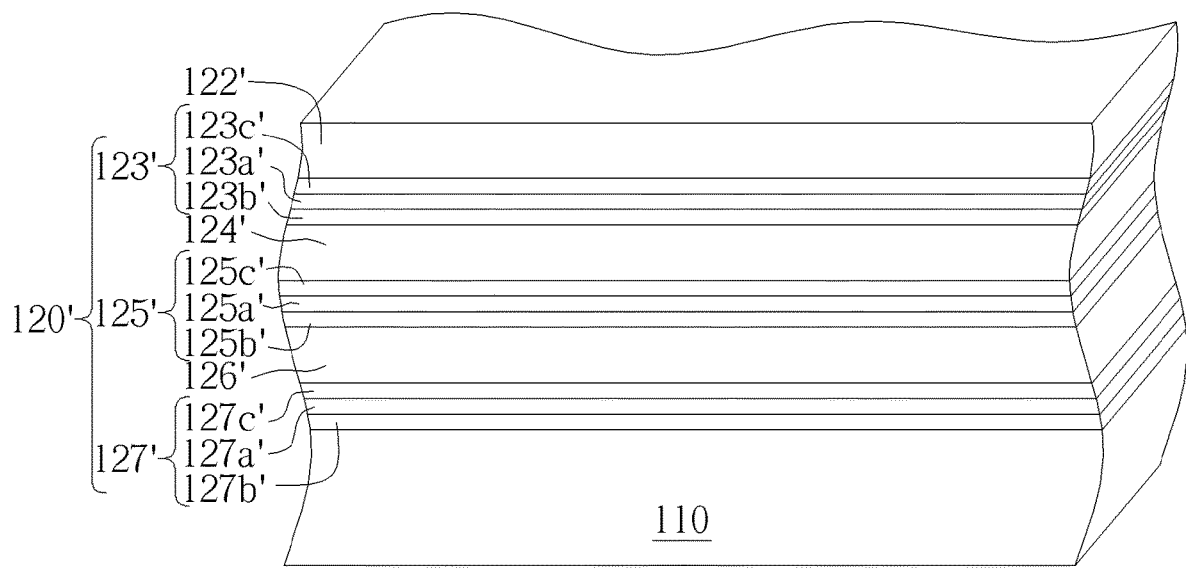
FIG. 1 schematically depicts a three-dimensional diagram of a semiconductor process according to an embodiment of the present invention.

FIGS. 1-7 schematically depict three-dimensional diagrams of a semiconductor process according to an embodiment of the present invention. As shown in FIG. 1, a stacked layer 120' is formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110 may be a bulk substrate, and the stacked layer 120' stacked on the substrate 110 is used for forming a stacked fin structure. In this case, the stacked layer 120' includes a first layer 122', a dielectric layer 123', a second layer 124', a dielectric layer 125', a third layer 126' and a dielectric layer 127'. The dielectric layer 127', the third layer 126', the dielectric layer 125', the second layer 124', the dielectric layer 123' and the first layer 122' are stacked from bottom to top. The first layer 122', the second layer 124' and the third layer 126' may be silicon containing layers such as silicon layers or silicon germanium layers serving as gate channels. The first layer 122', the second layer 124' and the third layer 126' are electrically isolated from each other by the dielectric layer 123', the dielectric layer 125' and the dielectric layer 127'.

Each of the dielectric layer 123', the dielectric layer 125' and the dielectric layer 127' may include a high-K dielectric layer. Preferably, each of the dielectric layer 123', the dielectric layer 125' and the dielectric layer 127' may include a high-K dielectric layer sandwiched by buffer layers. The buffer layers are used for buffering the high-K dielectric layer and the silicon containing layers (meaning the first layer 122', the second layer 124', the third layer 126', or the substrate 110). In this case, the dielectric layer 123' includes a high-K dielectric layer 123a' sandwiched by two buffer layers 123b'/123c'; the dielectric layer 125' includes a high-K dielectric layer 125a' sandwiched by two buffer layers 125b'/125c'; the dielectric layer 127' includes a high-K dielectric layer 127a' sandwiched by two buffer layers 127b'/127c', but it is not limited thereto. The buffer layers 123b'/123c'/125b'/125c'/127b'/127c' may be oxide layers, such as silicon oxide ($SiO_2$); the high-K dielectric layers 123a'/125a'/127a' may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST), but it is not limited thereto. In this case, the high-K dielectric layers 123a'/125a'/127a' are hafnium oxide layers.

Figure 2:
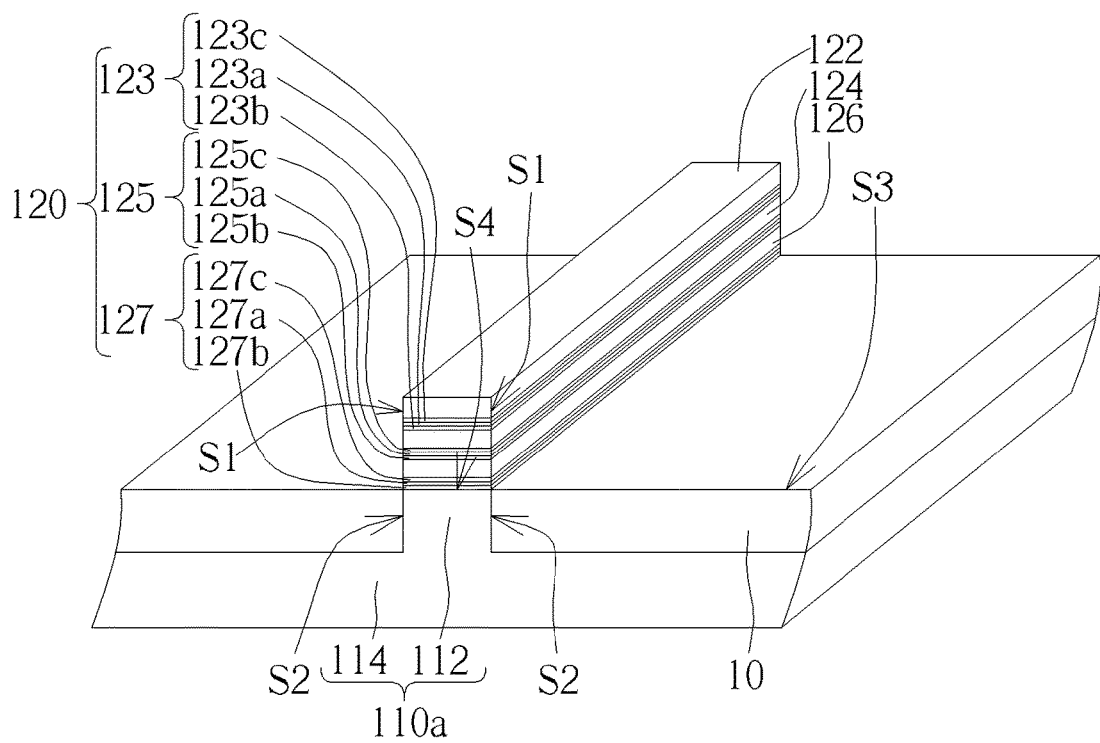
FIG. 2 schematically depicts a three-dimensional diagram of a semiconductor process according to an embodiment of the present invention.

As shown in FIG. 2, at least one stacked fin structure 120 is formed on a substrate 110a. Only one stacked fin structure 120 is depicted in this embodiment, but the present invention is not restricted thereto. In this embodiment, the stacked layer 120' of FIG. 1 is patterned to form the stacked fin structure 120 on the substrate 110a, wherein the stacked fin structure 120 may include a first fin layer 122, a fin dielectric layer 123, a second fin layer 124, a fin dielectric layer 125, a third fin layer 126 and a fin dielectric layer 127. The fin dielectric layer 127, the third fin layer 126, the fin dielectric layer 125, the second fin layer 124, the fin dielectric layer 123 and the first fin layer 122 are stacked from bottom to top. The first fin layer 122, the second fin layer 124 and the third fin layer 126 may be silicon containing layers such as silicon layers or silicon germanium layers serving as gate channels, and the first fin layer 122, the second fin layer 124, the third fin layer 126 and the substrate 110a are electrically isolated from each other by the fin dielectric layer 123, the fin dielectric layer 125 and the fin dielectric layer 127.

Each of the fin dielectric layer 123, the fin dielectric layer 125 and the fin dielectric layer 127 may include a high-K dielectric layer. This means the fin dielectric layer 123 includes a high-K dielectric layer 123a, the fin dielectric layer 125 includes a high-K dielectric layer 125a, and the fin dielectric layer 127 includes a high-K dielectric layer 127a. Moreover, the fin dielectric layer 123 may include the high-K dielectric layer 123a sandwiched by two buffer layers 123b/123c; the fin dielectric layer 125 may include the high-K dielectric layer 125a sandwiched by two buffer layers 125b/125c; the fin dielectric layer 127 may include the high-K dielectric layer 127a sandwiched by two buffer layers 127b/127c, but it is not limited thereto. The first fin layer 122 may include a silicon fin layer, the second fin layer 124 may include a silicon germanium fin layer, and the third fin layer 126 may include a silicon fin layer; perhaps, the first fin layer 122, the second fin layer 124 and the third fin layer 126 all include silicon fin layers, depending upon practical requirements.

In this embodiment, a part of the substrate 110 is patterned while the stacked layer 120' of FIG. 1 is patterned, to form the substrate 110a, wherein the substrate 110a may include a fin part 112 on a bulk bottom part 114. The stacked fin structure 120 is directly formed on the fin part 112 of the substrate 110a. Sidewalls S1 of the stacked fin structure 120 are trimmed with sidewalls S2 of the fin part 112. For clarifying the present invention, only one stacked fin structure 120 and the fin part 112 are depicted, but a plurality of stacked fin structures 120 and the fin parts 112 can be applied in the present invention.

Since the fin dielectric layer 127 is sandwiched by the third fin layer 126 and the substrate 110a, the fin dielectric layer 125 is sandwiched by the third fin layer 126 and the second fin layer 124, and the fin dielectric layer 123 is sandwiched by the second fin layer 124 and the first fin layer 122, the first fin layer 122, the second fin layer 124 and the third fin layer 126 can serve as gate channels respectively. Thicknesses and materials of the first fin layer 122, the second fin layer 124 and the third fin layer 126 may be different to have different channel properties, depending upon practical requirements. Preferably, the fin dielectric layer 127 is located at the bottom of the stacked fin structure 120 and directly contacts the substrate 110a to prevent circuit leakage flowing from the stacked fin structure 120 to the substrate 110a. There are three fin layers respectively sandwiched by the fin dielectric layers in this embodiment, but the number of the fin layers and the fin dielectric layers are not restricted thereto. In the present invention, a plurality of fin layers are sandwiched by a plurality of fin dielectric layers, to form a plurality of gate channels in one same gate transistor, thereby the controlling of the gate can being improved. The first fin layer, the second fin layer and the third fin layer are just terms representing each fin layers, and the structure of the present invention may be described as a first fin layer, a plurality of fin dielectric layers and a plurality of second fin layers, the first fin layer, the fin dielectric layers and the second fin layers are stacked arranged, wherein the fin dielectric layers are sandwiched by the first fin layer and each of the second fin layers to electrically isolate the first fin layer and each of the second fin layers from each other.

An isolation structure 10 is formed on the bulk bottom part 114 beside the stacked fin structure 120 and the fin part 112. The isolation structure 10 may be a shallow trench isolation (STI) structure, which may be formed by a shallow trench isolation process, but it is not limited thereto. In this case, a top surface S3 of the isolation structure 10 is trimmed with a top surface S4 of the fin part 112, therefore the whole stacked fin structure 120 protruding from and above the isolation structure 10. Besides, the fin dielectric layer 127 is at the bottom of the stacked fin structure 120, thereby preventing currents in a later formed gate disposed over the stacked fin structure 120 from flowing into the substrate 110a.

Figure 3:
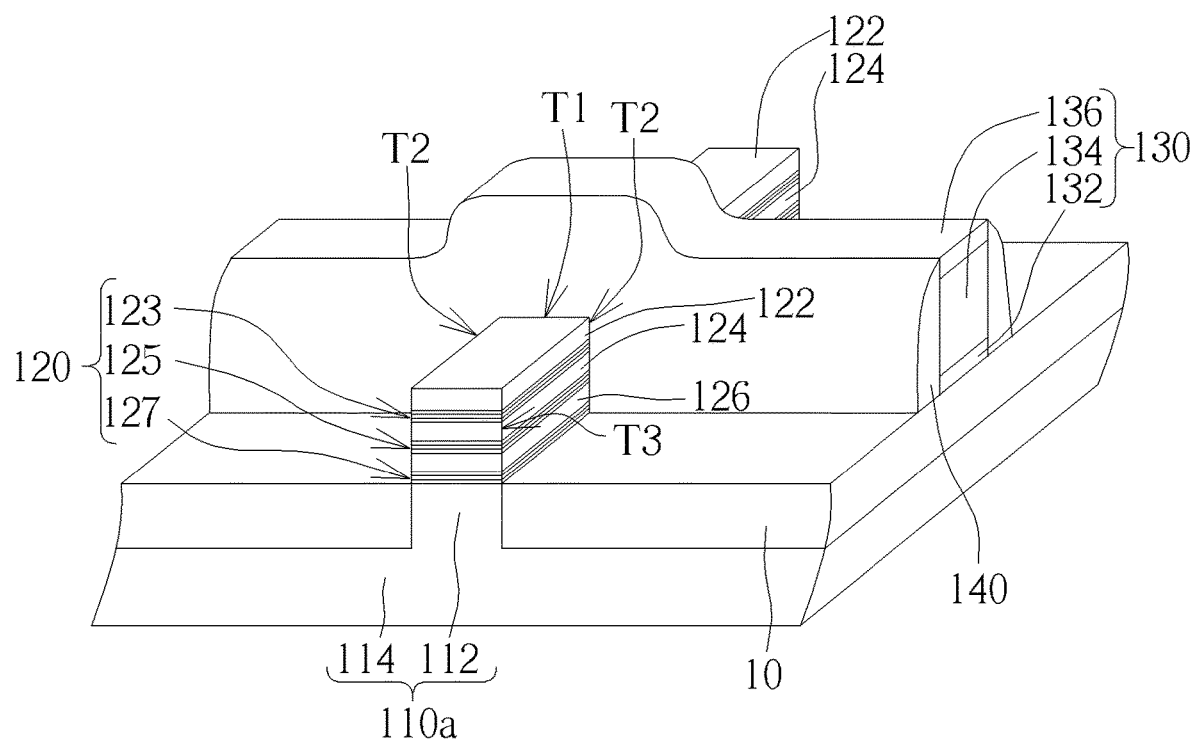
FIG. 3 schematically depicts a three-dimensional diagram of a semiconductor process according to an embodiment of the present invention.

As shown in FIG. 3, a gate 130 is formed across the stacked fin structure 120. The gate 130 may include a buffer layer (not shown), a gate dielectric layer 132, a gate conductive layer 134 and a cap layer 136. More precisely, a buffer layer (not shown), a dielectric layer (not shown), agate layer (not shown) and a cap layer (not shown) may be sequentially and blanketly deposited and then patterned to form the buffer layer (not shown), the gate dielectric layer 132, the gate conductive layer 134 and the cap layer 136. By doing this, the gate 130 is disposed over the stacked fin structure 120. The first fin layer 122 is at the top of the stacked fin structure 120, and the gate 130 contacts a top surface T1 and two sidewalls T2 of the first fin layer 122. The second fin layer 124 is at the middle of the stacked fin structure 120, and the gate 130 contacts two sidewalls T3 of the second fin layer 124.

The buffer layer (not shown) is optionally formed to buffer the gate dielectric layer 132 and the stacked fin structure 120. The buffer layer (not shown) may be an oxide layer, but it is not limited thereto. As a gate-last for high-K first process or a gate first process is applied, the gate dielectric layer 132 is a high-K dielectric layer, which may be a metallic containing dielectric layer such as a hafnium oxide layer or a zirconium oxide layer, but it is not limited thereto. The gate dielectric layer 132 may be the group selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalite (SrBi$_2$Ta$_2$O$_9$, SBT), lead zirconate titanate (PbZr$_x$Ti$_{1-x}$O$_3$, PZT) and barium strontium titanate (Ba$_x$Sr$_{1-x}$TiO$_3$, BST). In this case, a gate-last for high-K last process is applied, the gate dielectric layer 132 may thus be an oxide layer, which may be replaced by a high-K dielectric layer in later processes. The gate conductive layer 134 may be a polysilicon sacrificial gate layer, and may be replaced by a metal gate in later processes, but it is not limited thereto. The cap layer 136 may be one single layer or a multilayer, which may be constituted by a nitride layer, an oxide layer or/and etc, to serve as a hard mask in etching processes. The gate 130 may further include a barrier layer (not shown) between the gate dielectric layer 132 and the gate conductive layer 134, and the barrier layer (not shown) may include one single layer or a multilayer composed of materials such as titanium nitride or tantalum nitride etc.

A spacer 140 may be formed on the stacked fin structure 120 and the substrate 110a beside the gate 130. More precisely, a spacer material (not shown) may be formed blanketly to cover the stacked fin structure 120, the isolation structure 10 and the substrate 110a. Then, the spacer material (not shown) is etched back to form the spacer 140. The spacer 140 may include one single layer or a multilayer composed of materials such as silicon nitride or/and silicon oxide etc.

Figure 4:
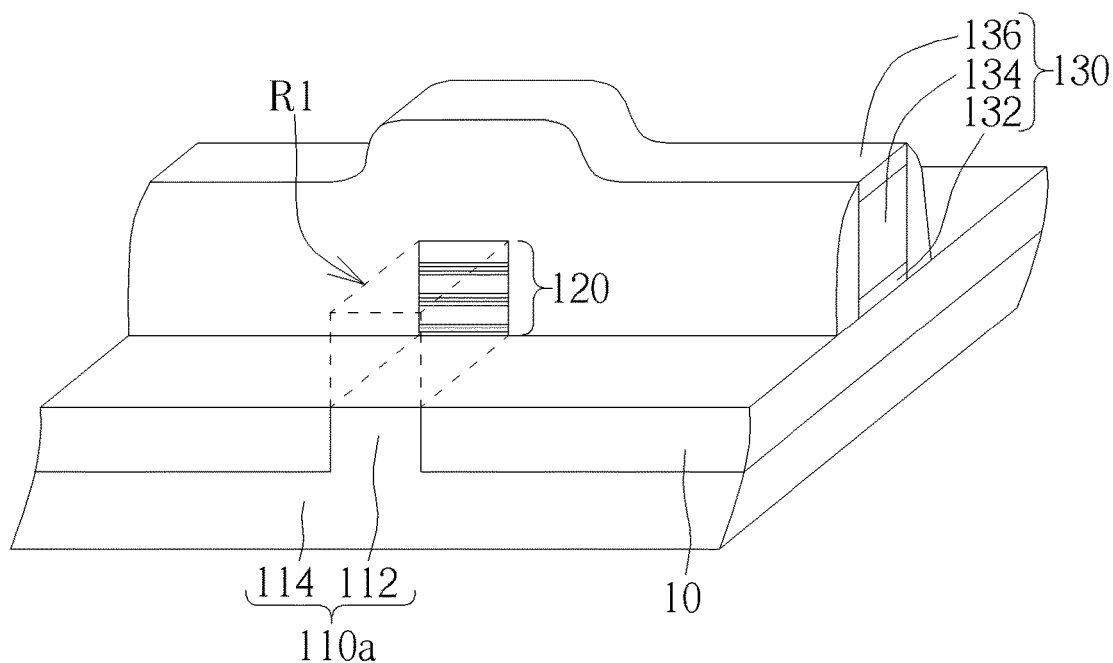
FIG. 4 schematically depicts a three-dimensional diagram of a semiconductor process according to an embodiment of the present invention.
Figure 5:
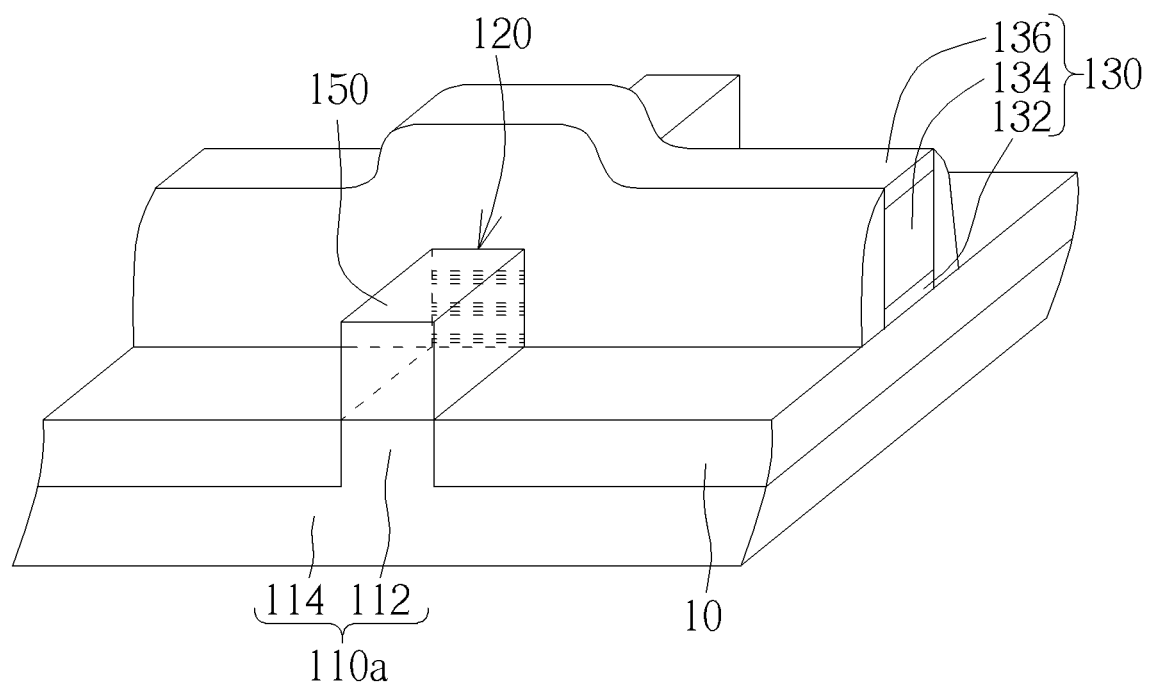
FIG. 5 schematically depicts a three-dimensional diagram of a semiconductor process according to an embodiment of the present invention.

The stacked fin structure 120 beside the gate 130 is etched to form recesses R1 in the stacked fin structure 120 and expose the substrate 110a, as shown in FIG. 4. As shown in FIG. 5, a source/drain 150 is formed in the recesses R1 and directly contacts the substrate 110a. Preferably, the source/drain 150 contacts the whole sidewalls of the stacked fin structure 120 to contact each gate channels. The source/drain 150 may be formed by an epitaxial process, which may be grown from the fin part 112, but it is not limited thereto.

Figure 6:
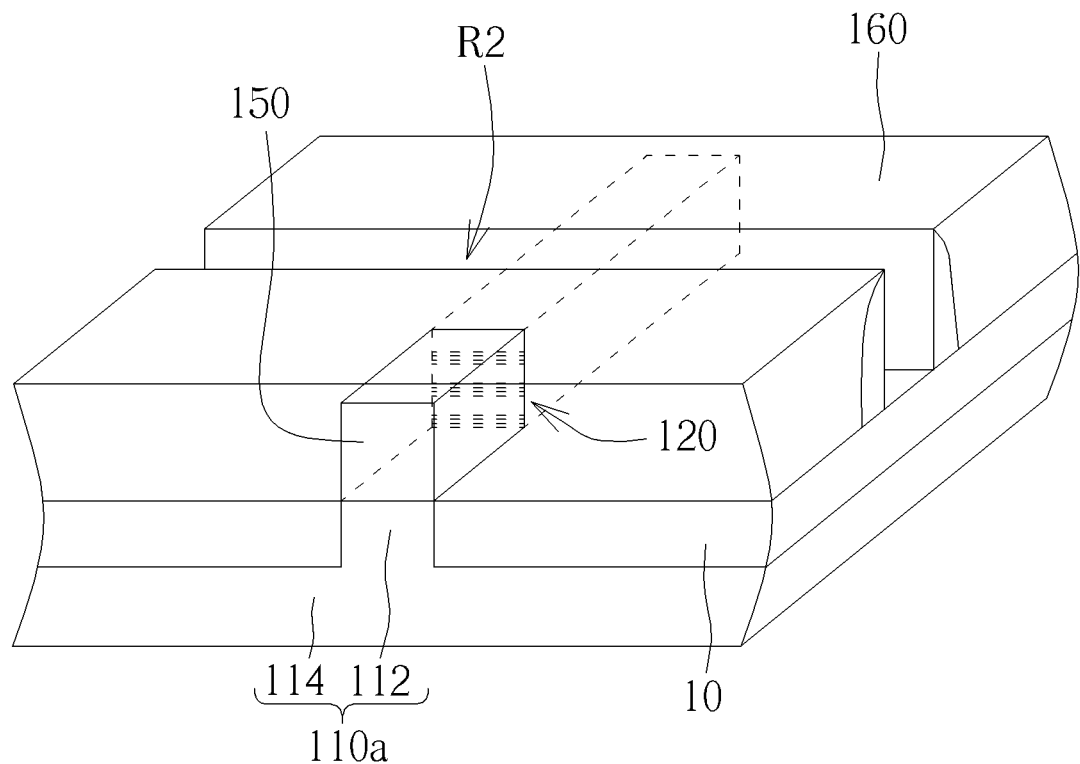
FIG. 6 schematically depicts a three-dimensional diagram of a semiconductor process according to an embodiment of the present invention.
Figure 7:
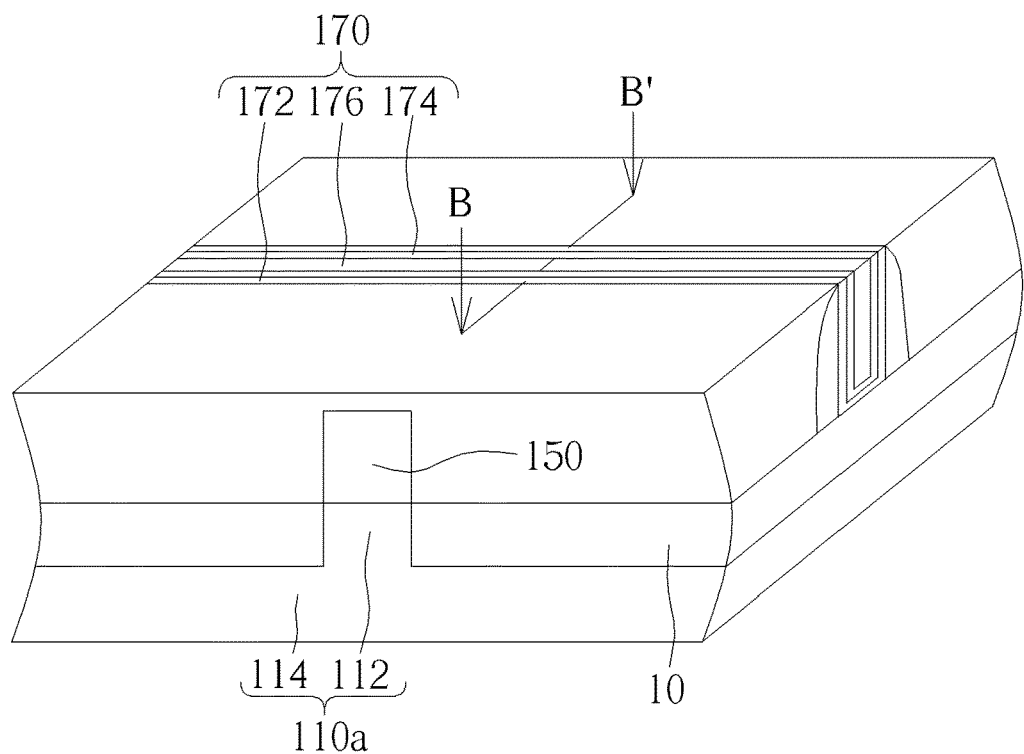
FIG. 7 schematically depicts a three-dimensional diagram of a semiconductor process according to an embodiment of the present invention.
Figure 8:
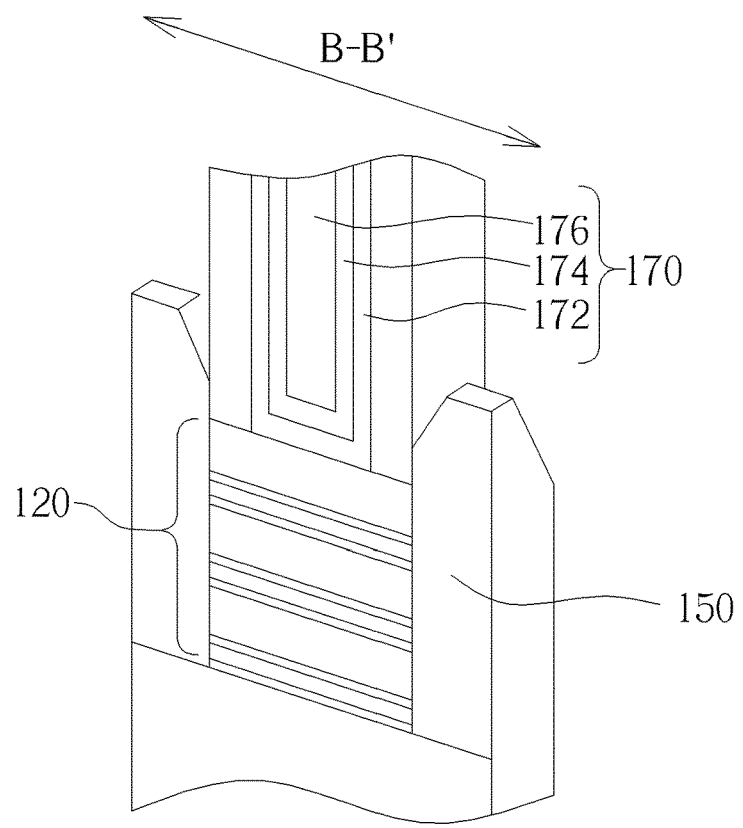
FIG. 8 schematically depicts a partial cross-sectional view of FIG. 7 along line BB'.

Please refer to FIGS. 6-7, after the source/drain 150 is formed, a metal gate replacement process is performed to replace the gate 130 by a metal gate 170. For clarifying the present invention, FIG. 8 schematically depicting a partial cross-sectional view of FIG. 7 along line BB' is also presented. As shown in FIG. 6, an inter-dielectric layer 160 may blanketly cover the source/drain 150 and the isolation structure 10 beside the gate 130 and expose the gate 130. Then, the gate 130 is removed to form a recess R2 and expose the stacked fin structure 120. Thereafter, as shown in FIGS. 7-8, the metal gate 170 is formed in the recess R2. The metal gate 170 may include a gate dielectric layer 172, a work function metal layer 174 and a low resistivity material 176. The gate dielectric layer 172, the work function metal layer 174 and the low resistivity material 176 have U-shaped cross-sectional profiles. The gate dielectric layer 172 may be a metallic containing dielectric layer having a high dielectric constant, which may include hafnium oxide or zirconium oxide; the work function metal layer 174 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN); the low resistivity material 176 may be composed of aluminum, tungsten, titanium aluminum (TiAl) alloy, cobalt tungsten phosphide (CoWP), but it is not limited thereto. Barrier layers may be selectively formed between the gate dielectric layer 172, the work function metal layer 174 and the low resistivity material 176, and the barrier layers may include one single layer or a multilayer composed of materials such as titanium nitride or/and tantalum nitride etc.

To summarize, the present invention provides a semiconductor structure and process thereof, which forms a stacked fin structure on a substrate, wherein the stacked fin structure includes a plurality of fin layers and a plurality of fin dielectric layers, and each of the fin layers is sandwiched by the fin dielectric layers, to electrically isolate the fin layers and the substrate from each other. Thus, as a gate is disposed over the stacked fin structure, the controlling of the gate can be improved.

Preferably, a source/drain is directly disposed on the substrate and contact the whole sidewalls of the stacked fin structure for connecting the whole gate channels. One of the fin dielectric layers is at the bottom of the stacked fin structure and contacts the substrate to prevent circuit leakage in the stacked fin structure from flowing to the substrate. Each of the fin dielectric layers may include a high-K dielectric layer, and the high-K dielectric layer is preferably sandwiched by two buffer layers to buffer the high-K dielectric layer and the fin layers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    at least one stacked fin structure located on a substrate, wherein the stacked fin structure comprises a first fin layer, a plurality of second fin layers, and a plurality of fin dielectric layers, the first fin layer, the fin dielectric layers and the second fin layers are stacked arranged, wherein the fin dielectric layers are sandwiched by the first fin layer and each of the second fin layers to electrically isolate the first fin layer and each of the second fin layers from each other, wherein one of the fin dielectric layers is at the bottom of the stacked fin structure and contacts the substrate;
    a gate disposed over the stacked fin structure; and
    a source/drain disposed directly on the substrate and on sidewalls of the whole stacked fin structure.

2. The semiconductor structure according to claim 1, wherein the first fin layer is at the top of the stacked fin structure and contacts the gate with a top surface and two sidewalls, and the second fin layer is at the middle of the stacked fin structure and contacts the gate with two sidewalls.

3. The semiconductor structure according to claim 1, wherein the first fin layer and the second fin layer comprise silicon fin layers.

4. The semiconductor structure according to claim 1, wherein the first fin layer comprises a silicon fin layer and the second fin layer comprises a silicon germanium fin layer.

5. The semiconductor structure according to claim 1, wherein the fin dielectric layer comprises a high-K dielectric layer.

6. The semiconductor structure according to claim 5, wherein the high-K dielectric layer comprises a hafnium oxide layer.

7. The semiconductor structure according to claim 5, wherein the fin dielectric layer comprises the high-K dielectric layer sandwiched by two buffer layers.

8. The semiconductor structure according to claim 7, wherein the buffer layers comprise oxide layers.

9. The semiconductor structure according to claim 1, wherein the gate comprises a gate dielectric layer and a gate conductive layer.

10. The semiconductor structure according to claim 9, wherein the gate conductive layer comprises a metal gate.

11. The semiconductor structure according to claim 1, wherein a thickness of the first fin layer is different from a thickness of the second fin layer.

12. The semiconductor structure according to claim 1, further comprising:
   a spacer disposed on the stacked fin structure and the substrate beside the gate.

13. The semiconductor structure according to claim 1, further comprising:
   an isolation structure disposed beside the stacked fin structure.

14. The semiconductor structure according to claim 13, wherein the whole stacked fin structure protrudes from and above the isolation structure.

15. The semiconductor structure according to claim 10, wherein the metal gate comprises a work function metal layer and a low resistivity material.

16. The semiconductor structure according to claim 15, wherein the work function metal layer has a U-shaped cross-sectional profile.

\* \* \* \* \*